(12) United States Patent
Pratt et al.

(10) Patent No.: US 10,686,415 B2
(45) Date of Patent: Jun. 16, 2020

(54) DIGITAL PREDISTORTION FOR MULTIPLE POWER AMPLIFIERS

(71) Applicants: Patrick Pratt, Mallow (IE); Rafael Celedon, Atlanta, GA (US)

(72) Inventors: Patrick Pratt, Mallow (IE); Rafael Celedon, Atlanta, GA (US)

(*) Notice: Subject to any disclaimer, the term of this patent is extended or adjusted under 35 U.S.C. 154(b) by 0 days.

(21) Appl. No.: 15/856,985

(22) Filed: Dec. 28, 2017

(65) Prior Publication Data

US 2018/0191314 A1 Jul. 5, 2018

Related U.S. Application Data

(60) Provisional application No. 62/440,287, filed on Dec. 29, 2016.

(51) Int. Cl.
*H03F 1/26* (2006.01)
*H03F 3/21* (2006.01)
(Continued)

(52) U.S. Cl.
CPC .......... *H03F 3/211* (2013.01); *H03F 1/0233* (2013.01); *H03F 1/0277* (2013.01);
(Continued)

(58) Field of Classification Search
CPC ........ H03F 3/211; H03F 1/0233; H03F 3/602; H03F 3/19; H03F 1/3252; H03F 1/0277; H03F 1/3247
(Continued)

(56) References Cited

U.S. PATENT DOCUMENTS 5,808,511 A * 9/1998 Kobayashi ............... H03G 7/08
330/149
8,154,432 B2 * 4/2012 Kaper .................. H03M 1/1052
330/149
(Continued)

FOREIGN PATENT DOCUMENTS

WO WO-2010054499 A1 5/2010
WO WO-2014085097 A1 6/2014
(Continued)

OTHER PUBLICATIONS

"International Application Serial No. PCT/US2017/068715, International Search Report dated Jun. 18, 2018", 6 pgs.
(Continued)

*Primary Examiner* — Khanh V Nguyen
*Assistant Examiner* — Khiem D Nguyen
(74) *Attorney, Agent, or Firm* — Schwegman Lundberg & Woessner, P.A.

(57) ABSTRACT

Various examples are directed to a power amplifier circuit, comprising a digital predistortion circuit, first and second power amplifiers, and a bias feedback circuit. The digital predistortion circuit may be configured to generate a predistorted input signal based at least in part on an input signal. The first power amplifier may be configured to generate a first amplified signal based at least in part on the predistorted input signal. The second power amplifier may be configured to generate a second amplified signal based at least in part on the predistorted input signal. The bias feedback circuit may be configured to adjust at least one of a bias of the first power amplifier or a bias of the second power amplifier to align a first nonlinear behavior of the first power amplifier with a second nonlinear behavior of the second power amplifier.

20 Claims, 14 Drawing Sheets

(51) Int. Cl.
| | |
|---|---|
| H03F 1/32 | (2006.01) |
| H03F 3/193 | (2006.01) |
| H03F 3/19 | (2006.01) |
| H03F 1/02 | (2006.01) |
| H03F 3/60 | (2006.01) |

(52) U.S. Cl.
CPC ......... *H03F 1/3247* (2013.01); *H03F 1/3252* (2013.01); *H03F 3/19* (2013.01); *H03F 3/193* (2013.01); *H03F 3/602* (2013.01); *H03F 2201/3215* (2013.01); *H03F 2201/3227* (2013.01)

(58) Field of Classification Search
USPC ............. 330/149, 295, 124 R; 375/296, 297; 455/114.3
See application file for complete search history.

(56) References Cited

U.S. PATENT DOCUMENTS

| | | | |
|---|---|---|---|
| 8,829,993 | B2 | 9/2014 | Briffa et al. |
| 2010/0020899 | A1 | 1/2010 | Szopko et al. |
| 2010/0253426 | A1* | 10/2010 | Su .......................... H03F 1/02 330/149 |
| 2015/0372646 | A1 | 12/2015 | Briffa et al. |
| 2016/0087604 | A1 | 3/2016 | Kim |

FOREIGN PATENT DOCUMENTS

| | | |
|---|---|---|
| WO | WO-2018126010 | 7/2018 |
| WO | WO-2018126010 A3 | 8/2018 |

OTHER PUBLICATIONS

"International Application Serial No. PCT/US2017/068715, Invitation to Pay Add'l Fees and Partial Search Report dated Apr. 9, 2018", 12 pgs.

"International Application Serial No. PCT/US2017/068715, Written Opinion dated Jun. 18, 2018", 10 pgs.

"NanoSemi, N.A.T. and Fraunhofer HHI at NGMN Industry Forum: Massive MIMO SDR Demonstration with Linearized Power Amplifiers", 10th NGMN Industry Conference & Exhibition, Frankfurt: Oct. 12-13, 2016, [online]. [retrieved on Nov. 15, 2016], Retrieved from the Internet: <URL: http://www.nanosemitech.com/nanosemi-n-t-fraunhofer-hhi-ngmn-industry-forum-massive-mimo-sdr-demonstration-linearized-power-amplifiers/>, (2016), 5 pgs.

Amin, Shoaib, et al., "Behavioral Modeling and Linearization of Crosstalk and Memory Effects in RF MIMO Transmitters", IEEE Transactions on Microwave Theory and Techniques, 62(4), (Apr. 2014), 810-823.

Cao, Haiying, et al., "Digital Predistortion for Dual-Input Doherty Amplifiers", Proceedings, IEEE Topical Conference on Power Amplifiers for Wireless and Radio Applications, PAWR 2012, Santa Clara, CA, Jan. 15-18, 2012, (2012), 45-48.

Lee, Sangil, et al., "Digital Predistortion for Power Amplifiers in Hybrid MIMO Systems with Antenna Subarrays", 2015 IEEE 81st Vehicular Technology Conference (VTC Spring), (2015), 5 pgs.

\* cited by examiner

DIGITAL PREDISTORTION FOR MULTIPLE POWER AMPLIFIERS

CLAIM OF PRIORITY

The present application claims priority to U.S. Provisional Patent Application Ser. No. 62/440,287, filed Dec. 29, 2016, the complete subject matter of which is hereby incorporated by reference in its entirety.

TECHNICAL FIELD

This document pertains generally, but not by way of limitation, to integrated circuits and communication systems, and particularly, but not by way of limitation to digital predistortion for power amplifiers.

BACKGROUND

Radiofrequency (RF) communications, such as for mobile telephony and cable television, may use an RF power amplifier (PA) circuit in an RF transmitter to produce the RF signal for transmission over the air to an RF receiver. The PA circuit may have a nonlinear gain characteristic, such as gain compression occurring at higher power output levels, which can lead to signal distortion at such higher power levels. Digital predistortion (DPD) is used to pre-distort input to a PA to reduce distortion in the output of the PA.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

The patent or application file contains at least one drawing executed in color. Copies of this patent or patent application publication with color drawing(s) will be provided by the Office upon request and payment of the necessary fee.

FIG. 7 is a diagram showing one example of a circuit including multiple PAs and a single DPD circuit where the biasing of the PAs is modified to make their respective distortion characteristics more similar.

DETAILED DESCRIPTION

Various examples described herein are directed to systems and methods for using a single digital predistortion (DPD) circuit to predistort input signals for multiple power amplifiers (PAs). For example, there are many contexts in which it is desirable to provide the same input signal to multiple PAs. One example is in cable television and related cable communications where the same input signal (e.g., representing different television channel signals or other signals) may be transmitted to different customers across different coaxial and/or fiber trunk lines. Some mobile telephony applications also provide the same input signal to multiple PAs. For example, some mobile telephony technologies, such as 5$^{th}$ Generation (5G) wireless systems, utilize electromagnetic beamforming that involves transmitting the same input signal from different antennas at different power levels and phases.

Figure 1:
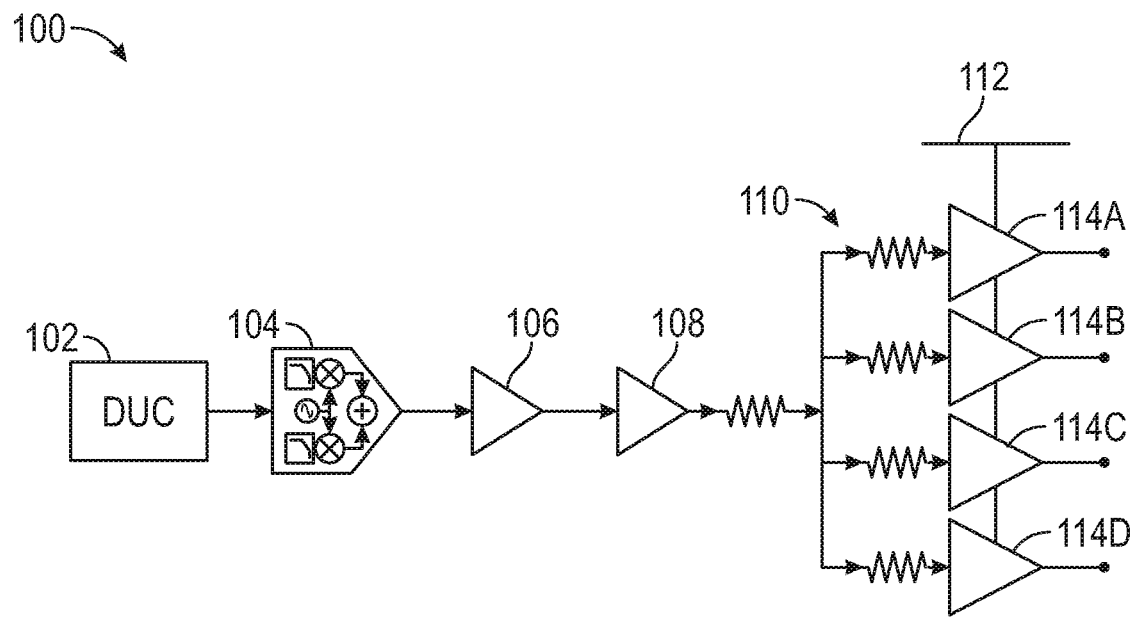
FIG. 1 shows a diagram of a circuit including multiple PAs.

FIG. 1 is a diagram of a circuit 100 including multiple PAs 114A-D. A single digital upconverter (DUC) 102 may upconvert an input signal to generate an upconverted input signal. A digital to analog converter (DAC) 104 converts the upconverted input signal to an analog input signal. Optional pre-amplifiers 106, 108 receive the analog input signal and generate a pre-amplified input signal. The pre-amplified input signal (or the analog input signal if pre-amplifiers are omitted) may be provided to a power splitter 110 that divides the signal into four components provided to the respective power amplifiers 114A-D. Bias power source 112 provides direct current (DC) biasing to the amplifiers 114-D. In the example circuit 100, each PA 114A-D provides an amplified output signal with a power of about 0.4 W, for a total output power of 1.6 W. To produce that 1.6 W, the DAC 104 consumes about 2.5 W, and the pre-amplifiers 106, 108 consume about 8 W, the bias power source consumes about 17.5 W per power amplifier 114A-D. The total power consumed, then, is about 80.5 W corresponding to a total system efficiency of about 2% (e.g., 1.2 W/80.5 W).

Figure 2:
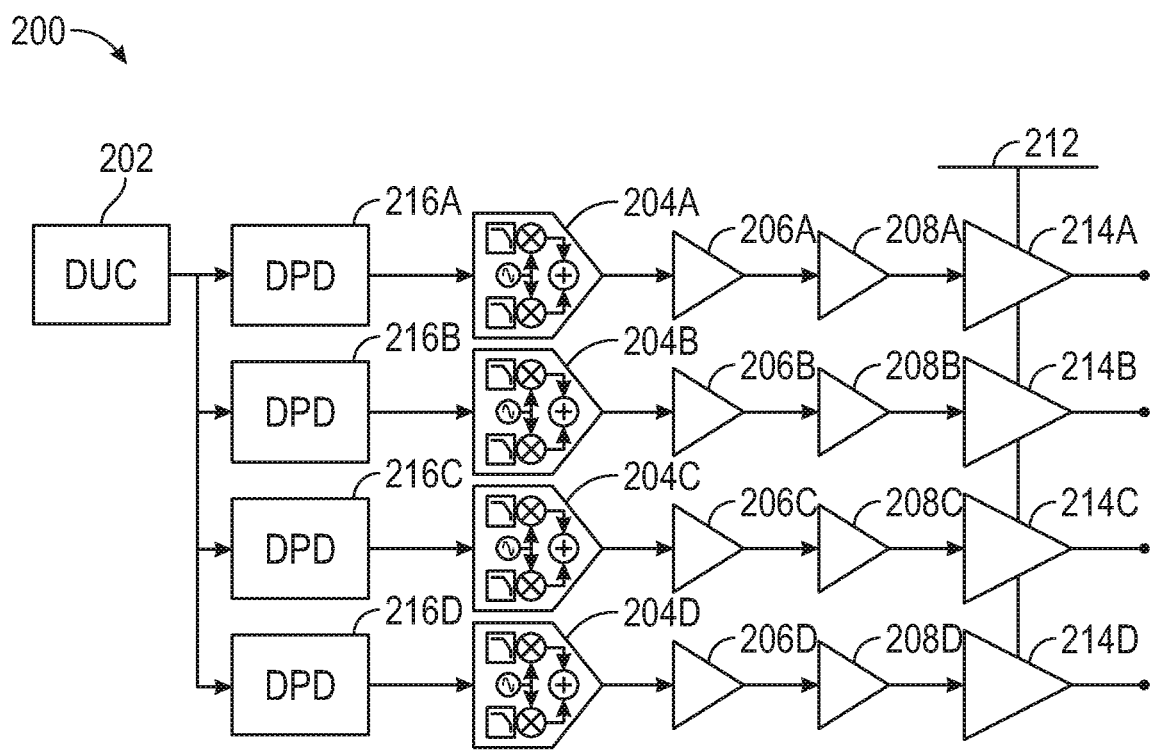
FIG. 2 is a diagram showing one example of a circuit including multiple PAs and multiple DPD circuits.

FIG. 2 is a diagram showing one example of a circuit 200 including multiple PAs 214A-D and multiple DPD circuits 216A-D. A DUC 202 provides an input signal to the respective DPD circuits 216A-D. The DPD circuits 216A-D may generate respective predistorted signals. The predistorted signals may be provided to respective DACs 204A-D, pre-amplifiers 206A-D, 208A-D and ultimately to PAs 214A-D. A bias power source 212 may bias the PAs 214A-D.

In the example circuit 200, the PAs 214A-D may each generate an output power of 0.4 W, for a total of 1.2 W of output power. The DPD circuits 216A-D may consume about 2 W each. DACs 204A-D may consume about 2.5 W each. Pre-amplifiers 206A-D, 208A-D may consume about 1 W each. Because the DPD circuits 216A-D allow the PAs 214A-D to be driven non-linearly, the bias power source 212 may only consume about 32.8 W. Accordingly, the total power consumed by the circuit to generate 1.2 W is about 58.8 W, for an efficiency of about 2.7%.

Figure 3:
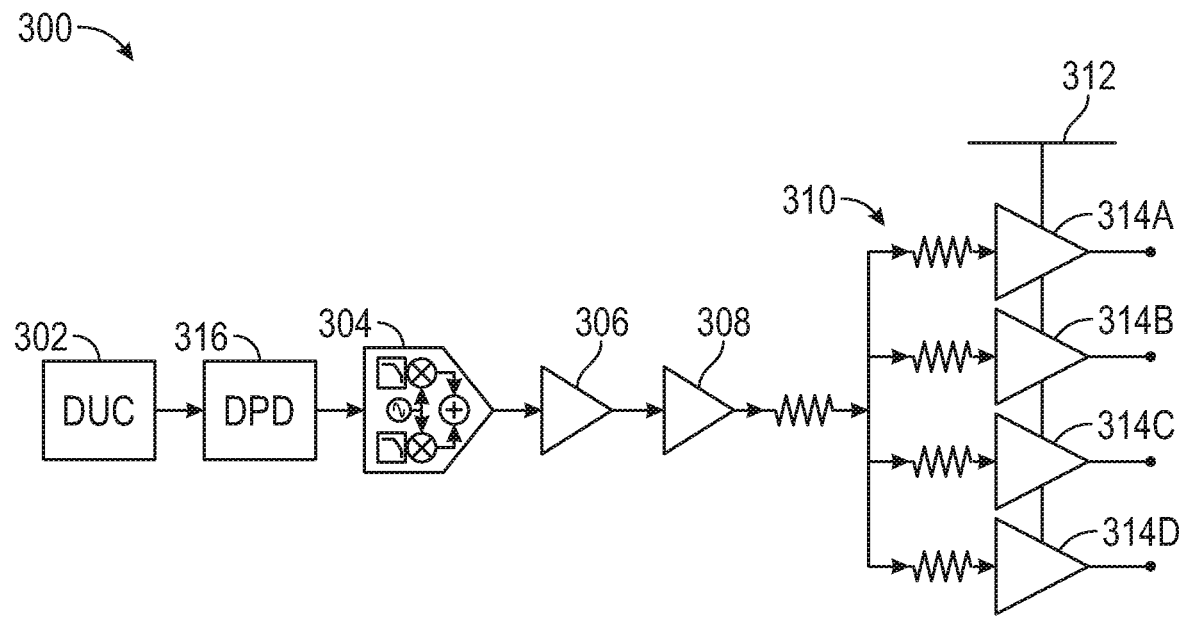
FIG. 3 is a diagram showing one example of a circuit including multiple PAs and a single DPD circuit.

FIG. 3 is a diagram showing one example of a circuit 300 including multiple PAs 314A-D and a single DPD circuit 316. A DUC 302 provides an input signal to the DPD circuit 316, which generates a predistorted input signal. The predistorted input signal is converted to a predistorted analog signal at the DAC 304. Pre-amplifiers 306, 308 provide amplification to the predistorted analog signal. A power splitter 310 splits the predistorted analog signal to provide respective inputs to PAs 314A-D. A bias power supply 312 biases the PAs 314A-D.

In the example circuit 300, the PAs 314A-D may each generate an output power of 0.4 W, for a total of about 1.2 W of output power. The DPD circuit 316 may consume about 2 W. The DAC 304 may consume about 2.5 W. The pre-amplifiers, collectively, may consume about 8 W; and the bias power supply may consume about 32.8 W. Accordingly, the total power consumed to generate the 1.2 W output is about 45.3 W, for an efficiency of about 3.5%.

Although FIGS. 1-3 show examples including four PAs, any suitable number of PAs may be included in similar example circuits according to the examples described herein. Also, power consumptions and efficiencies of the circuits 100, 200, 300 described in FIGS. 1-3 are examples. In some other examples, different components with different power consumption may be used.

Figure 4:
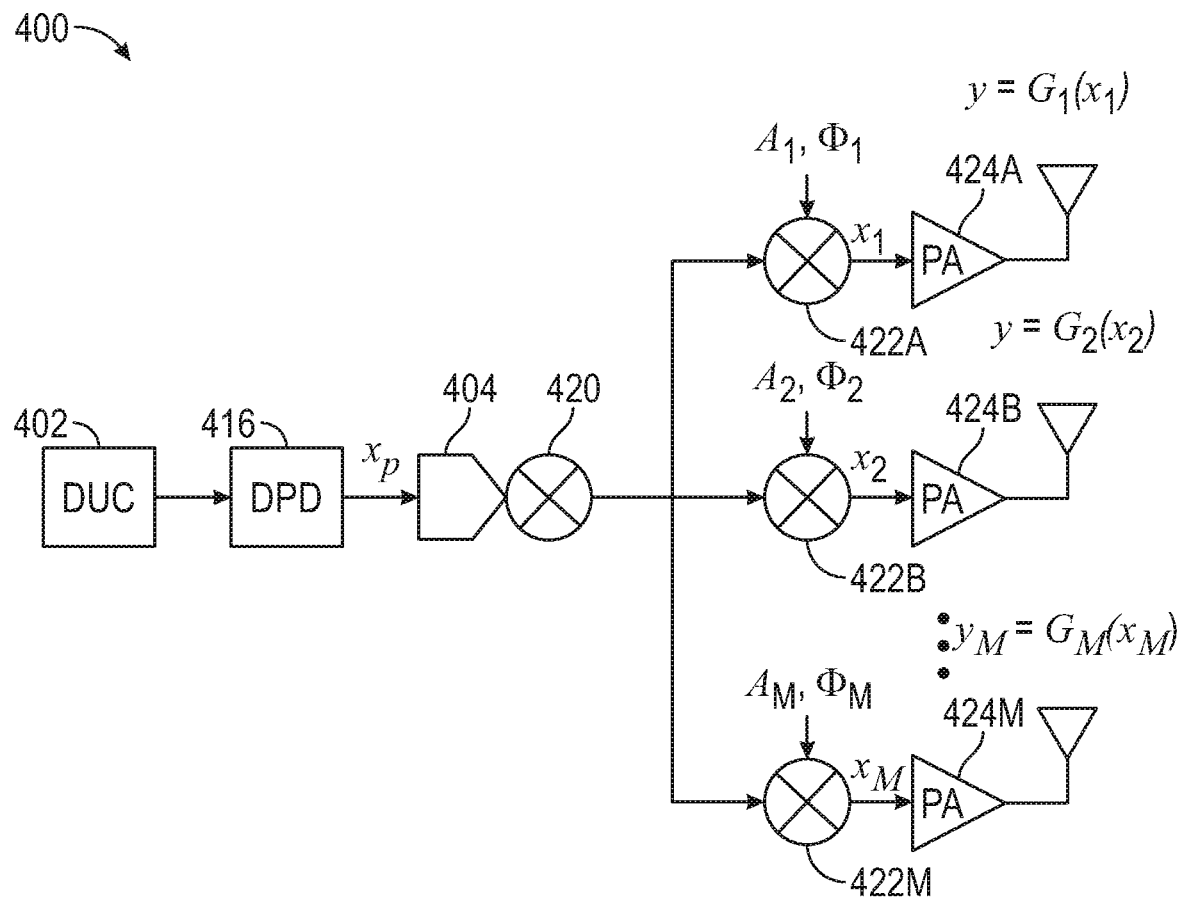
FIG. 4 is a diagram showing one example of a circuit for use in a wireless application including multiple PAs and a single DPD circuit.

FIG. 4 is a diagram showing one example of a circuit 400 for use in a wireless application including multiple PAs 424A, 424B, 424M and a single DPD circuit 416. In some examples, the circuit 400 may be used in a 5G hybrid beamforming application. The circuit 400 includes a DUC 402 that may provide an input signal to the DPD circuit 416. The DPD circuit 416 may generate a predistorted input signal, $x_p$. The predistorted input signal $x_p$ may be provided to the DAC 404. An analog predistorted input signal may be split at splitter 420 into M input signals for the M PAs 424A, 424B, 424M. At respective mixers 422A, 422B, 422N, the M signals are mixed with respective mixing signals having amplitudes $A_1, A_2, A_M$, and phases $\Phi_1, \Phi_2, \Phi_M$. For example, the respective mixing signals may introduce different amplitudes and phases to the respective M input signals for the PAs 424A, 424B, 424M so as to implement beamforming.

Figure 5:
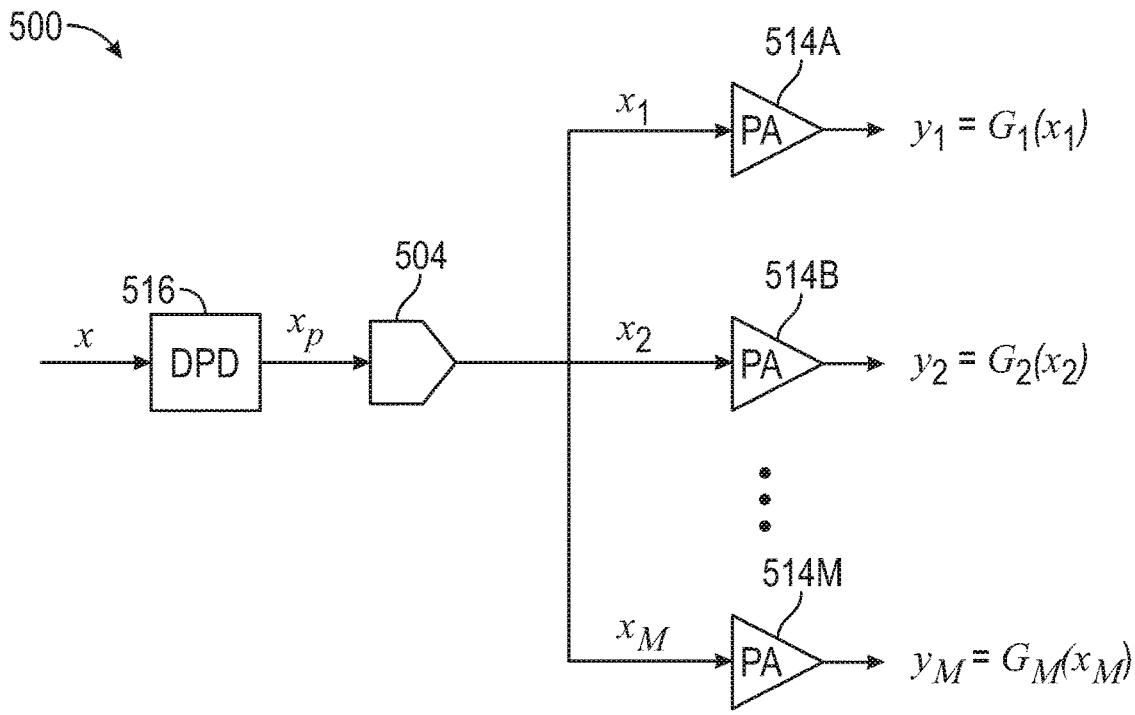
FIG. 5 is a diagram showing another example of a circuit including multiple PAs and a single circuit.

In some examples, utilizing a single DPD circuit for multiple PAs can introduce challenges, at least because different PAs may exhibit different distortion characteristics. Therefore, all things being equal, a predistorted signal that results in an acceptably linear output for one PA may not result in an acceptably linear output for another PA, leading to uneven system performance. For example, FIG. 5 is a diagram showing another example of a circuit 500 including multiple PAs 514A, 514B, 514M and a single DPD circuit. As shown, each PA 514A, 514B, 514M receives an analog predistorted input $x_M$.

The output of the respective PAs is given by Equations [1]-[3] below $$y_1 = G_1(x_1) \quad [1]$$

$$y_2 = G_2(x_2) \quad [2]$$

$$y_M = G_M(x_M) \quad [3]$$

Equation [1] shows the output characteristics of the PA 514A. Equation [2] shows the output characteristic of the PA 514B. Equation [3] shows the output characteristic of the PA 514M. Because the values of $G_1$, $G_2$, and $G_M$ may have different nonlinear components, the outputs $y_1$, $y_2$, $y_M$ may not be the same for the same predistorted input. An example equation illustrating the distortion characteristic $G_M$ for a PA is given by Equation [4] below:

$$y = xa_1 + x^3 a_3 + x^5 a_5 + \ldots \quad [4]$$

Distortion characteristics for the PA may be represented by the nonlinear terms of Equation [4]. The various coefficients $a_1$, $a_3$, $a_5$, etc., describe the magnitude of various order nonlinear terms. Although Equation [4], the PA includes only odd numbered nonlinear terms (e.g., 1, 3, 5, etc.), some PAs may include even numbered nonlinear terms in addition to or instead of odd numbered distortion terms as shown. Also, Equation [4] shows a memoryless model of a PA. For example, in Equation [4], the output of the PA (y) depends only on the current value of the model variable x. This model may describe PAs with outputs that do not significantly depend on past states of the PA. An example model of a PA with an output that does depend on past states of the PA is given herein, for example, with respect to Equation [7].

Figure 6:
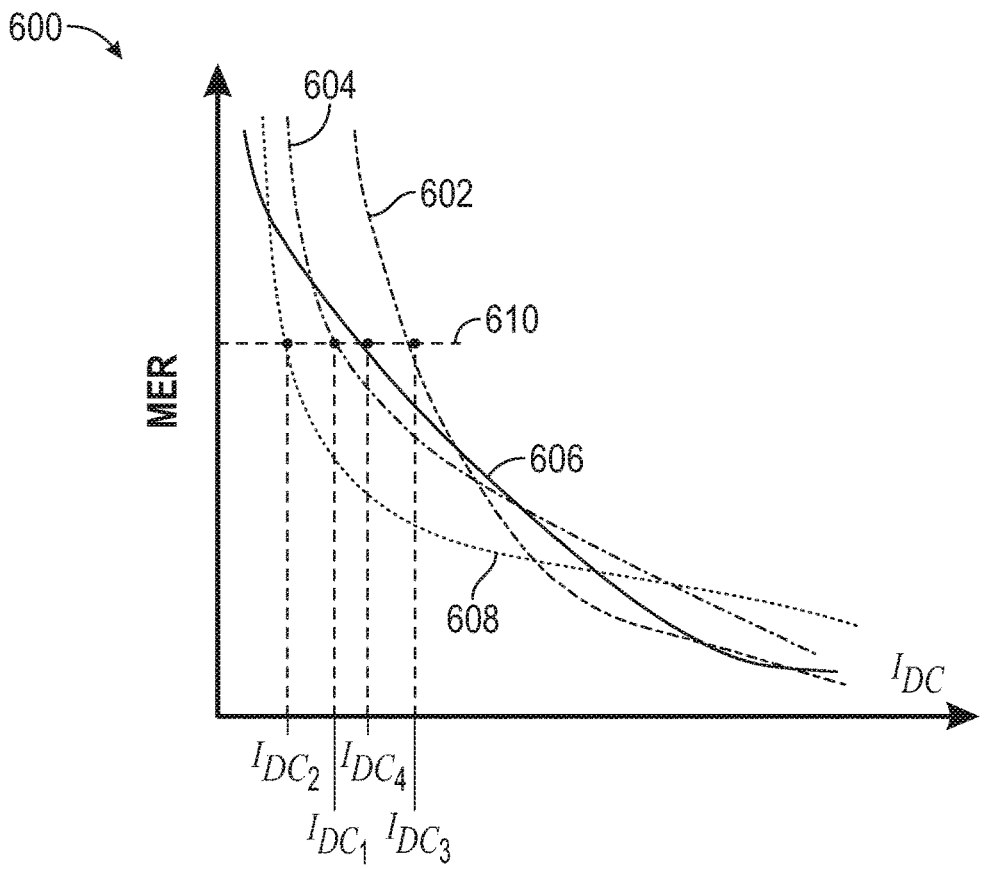
FIG. 6 is a chart showing example nonlinear characteristic curves for four example PAs.

In some examples, PAs utilizing a common DPD circuit the distortion characteristics of multiple PAs may be made more similar by differentially modifying the biasing of the PAs. For example, the bias current and/or voltage of the PAs may be individually set to make the distortion characteristics of the PAs more similar. This may include, for example, modifying the bias current provided to one or more of the PAs, modifying a bias voltage provided to one or more of the PAs, etc. FIG. 6 is a chart 600 showing example distortion characteristic curves 602, 604, 606, 608 for four example PAs. In the chart 600, the horizontal or x-axis indicates a bias current provided to the PAs ($I_{DC}$). The vertical or y-axis indicates a distortion characteristic. In the example of FIG. 6, the distortion characteristic is measured by a modulation error ratio or MER. For example, MER may describe a ratio of the actual output of the PAs over the ideal or undistorted output. As illustrated, the MER for the PAs may be made similar by selecting bias currents that correspond to the same value for the MER. For example, selecting the respective bias currents $I_{DC1}$, $I_{DC2}$, $I_{DC3}$, and $I_{DC4}$ for the respective PAs may cause each PA to have the same or a similar MER. This may enable a single DPD circuit to be used for each of the PAs.

Figure 7:
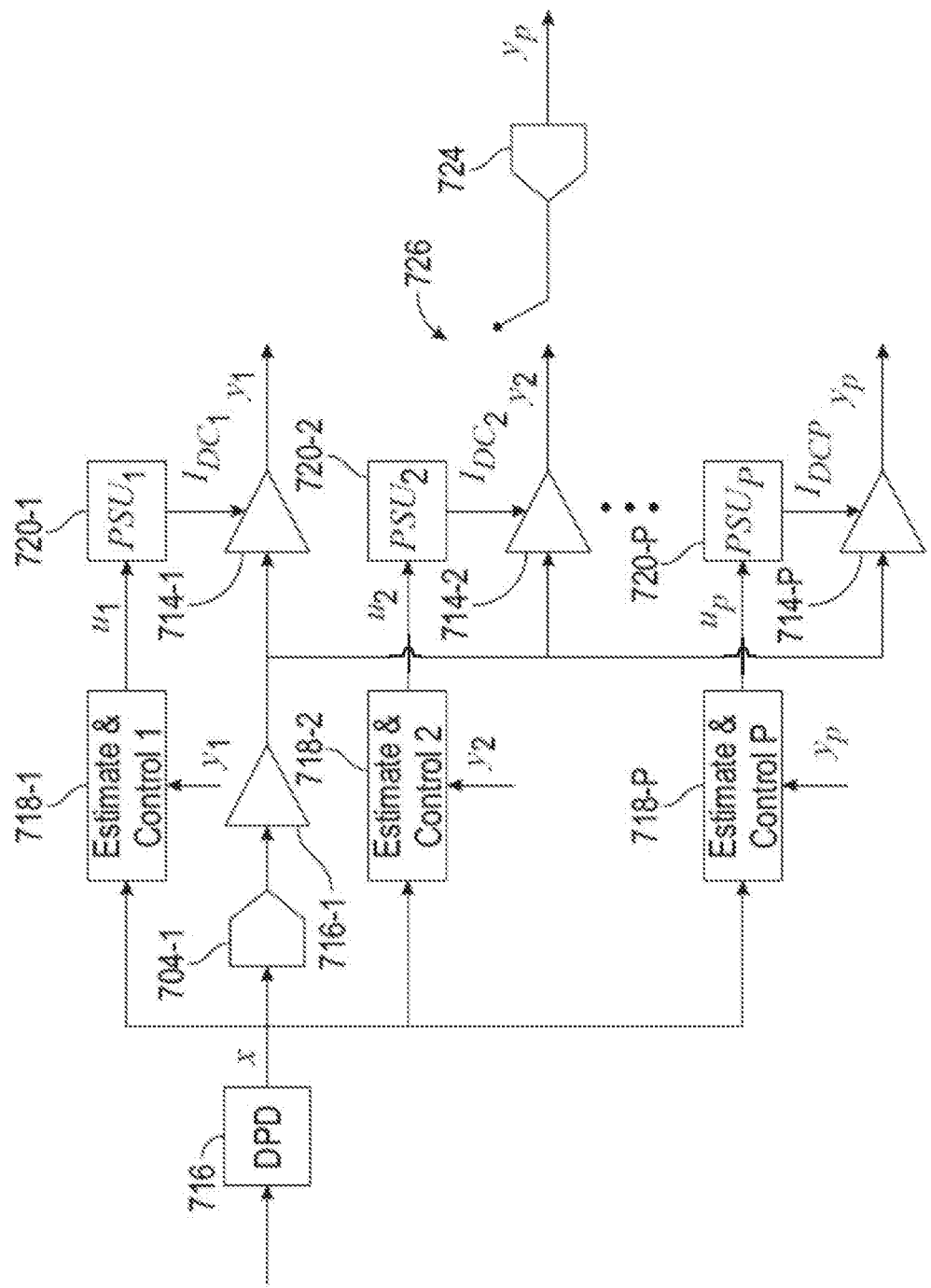

FIG. 7 is a diagram showing one example of a circuit 700 including multiple PAs 714-1, 714-2, 714-P and a single DPD circuit 716 where the biasing of the PAs 714-1, 714-2, 714-P is modified to make their respective distortion characteristics more similar. The DPD circuit 716 generates a predistorted input signal x that is provided to the various PAs 714-1, 714-2, 714-P. For example, the signal path from the DPD circuit 716 to the PA 714-1 is shown in FIG. 7. The predistorted input signal x is provided to a DAC 704-1, which generates an analog predistorted input signal x. An optional pre-amplifier 716-1 provides amplification to the analog predistorted input signal x, From the pre-amplifier 716-1, the signal proceeds to the PA 714-1, which generates an amplified output $y_1$. Signal paths from the DPD circuit 716 to the other PAs 714-2, 714-P may include similarly DACs and pre-amplifiers.

The PAs 714-1, 714-2, 714-P may be biased by a bias currents $I_{DC1}$, $I_{DC2}$, $I_{DC3}$, and $I_{DCP}$ provided by Power Supply Units (PSUs) 720-1, 720-2, 720-P. PSUs 720-1, 720-2, 720-P may receive respective bias control signals $u_1$, $u_2$, $u_P$ from respective Estimate & Control (E&C) circuits 718-1, 718-2, 718-P. PSUs 720-1, 720-2, 720-P may provide the bias currents $I_{DC1}$, $I_{DC2}$, $I_{DC3}$, and $I_{DCP}$ based on the respective bias control signals $u_1$, $u_2$, $u_P$. For example, the current $I_{DCP}$ may be proportional to or otherwise based on the bias control signal $u_1$, the current $I_{DC2}$ may be proportional to or otherwise based on the bias control signal $u_2$, and so on. Control signals $u_1$, $u_2$, $u_P$ may be analog or digital signals.

E&C circuits 718-1, 718-2, 718-P may generate the respective bias control signals $u_1$, $u_2$, $u_P$ based on feedback signals $y_1$, $y_2$, $y_P$. Feedback signals $y_1$, $y_2$, $y_P$ may represent the outputs of the various PAs 714-1, 714-2, 714-P. In some examples, feedback signals $y_1$, $y_2$, $y_P$ received by the E&C circuits 718-1, 718-2, 718-P may be digital signals. For example, the circuit 700 may include one or more analog-to-digital converters (ADCs) 724 to digitize the outputs of the PAs 714-1, 714-2, 714-P. In the example of FIG. 7, a single switched. ADC 724 is shown. The switch 726 may selectively connect the ADC 724 to the outputs of the PAs 714-1, 714-2, 714-P. For example, the ADC 724 may sequentially sample the outputs of the PAs 714-1, 714-2, 714-P and provide the resulting feedback signals $y_1$, $y_2$, $y_P$ to the respective E&C circuits 718-1, 718-2, 718-P.

Figure 8:
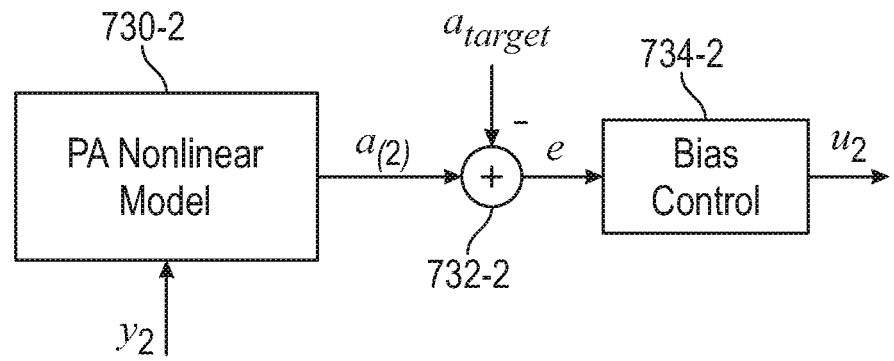
FIG. 8 is a diagram showing one example of an E&C circuit from the circuit of FIG. 7 including additional components.

FIG. 8 is a diagram showing one example of the E&C circuit 718-2 including additional components. For example, the feedback signal $y_2$ from the PA 714-2 is provided to a PA non-linear model (PA model) circuit 730-2. For example, the PA model circuit 730-2 may implement a model of the PA 714-2, such as the model described by Equation [4] above. Given the feedback signal $y_2$, the PA model circuit 730-2 may solve for a distortion characteristic a(2) of the PA 714-2. The distortion characteristic a(2) may be any suitable measure of the distortion of the PA 714-2. For example, the distortion characteristic a(2) may be one or more coefficients of a PA model, such as the model shown in Equation [4] or Equation below. In other examples, the distortion characteristic a(2) may be a measurement or approximation of the linearity (or nonlinearity) of the PA such as an MER, intermodulation distortion (IMD), signal-to-noise ratio (SNR), error vector magnitude (EVM), third-order intercept point (IP3), etc.

The distortion characteristic a(2) may be provided to a subtractor 732-2. The subtractor 732-2 may also receive a target distortion characteristic $a_{target}$, which may be provided to all PAs 714-1, 714-2, 714-P in the circuit 700. The difference between the distortion characteristic a(2) and the target distortion characteristic may be an error signal e that is provided to a bias control circuit 734-2. The bias control circuit 734-2 may generate the bias control signal $u_2$, based on the error signal e. Any suitable controller configuration may be used for the bias control circuit 734-2. For example, the bias control signal $u_2$ may be proportional to the error signal e. Although FIG. 8 shows the E&C circuit 718-2, in some examples, other E&C circuits 718-1, 718-P may be similarly arranged. For example, the target distortion characteristic $a_{target}$ may be received by all E&C circuits 718-1, 718-2, 718-P in the circuit 700. In some examples, the target distortion $a_{target}$ may be determined by a controller, such as an integral controller where the target distortion characteristic $a_{target}$ may be a running sum of the error signal e.

Figure 9:
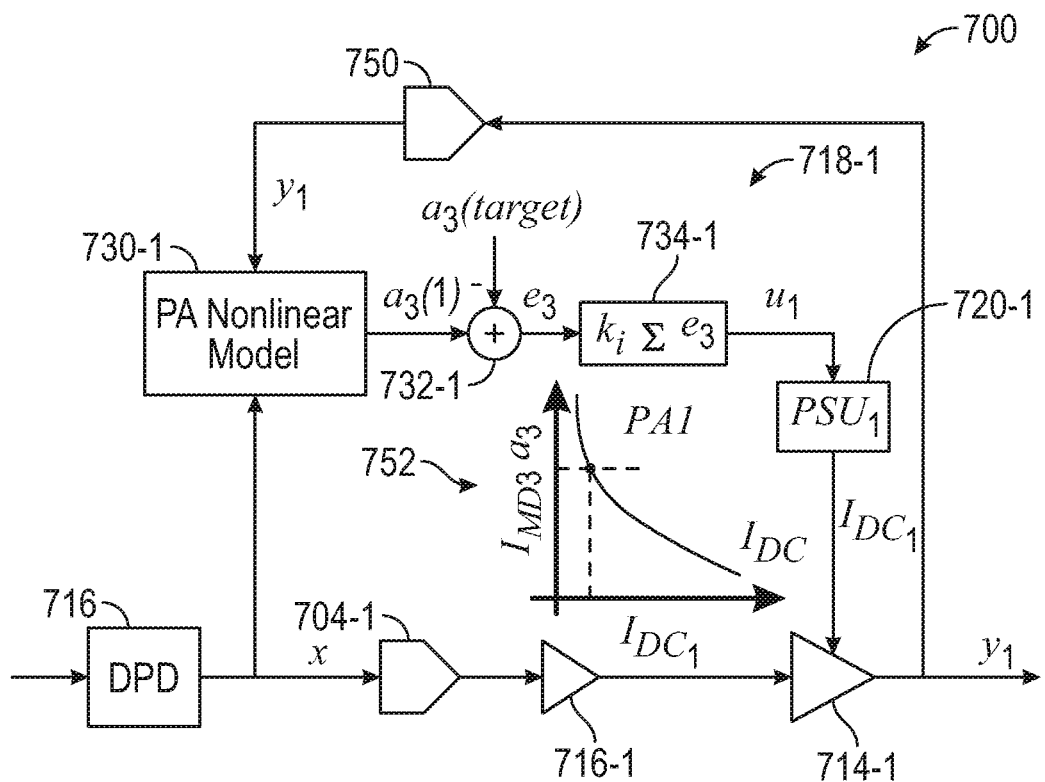
FIG. 9 is a diagram showing one example of a portion of the circuit of FIG. 7 including the DPD circuit, the PA, and the E&C circuit.

FIG. 9 is a diagram showing one example of a portion of the circuit 700 including the DPD circuit 716, the PA 714-1, and the E&C circuit 718-1. For example, the DPD circuit 716 is shown generating the predistorted input signal x that is converted to analog at the DAC 701-4, amplified at pre-amplifier 716-1 and provided to the PA 714-1. The E&C circuit 718-1 includes a PA model circuit 730-1, a subtractor 732-1, and the bias control circuit 734-1. An ADC 750 is shown connected to the output of the PA 714-1 to generate the feedback signal $y_1$ for the PA 714-1, The ADC 750 may be a dedicated ADC 750 generating the feedback signal $y_1$ only for the PA 714-1, or may be a switched ADC that samples all of the PAs 714-1, 714-2, 714-P to generate respective feedback signals $y_1$, $y_2$, $y_P$, similar to the ADC 724 and switch 726 shown in FIG. 7.

In the example of FIG. 9, the PAs may be dominated by third order, memoryless behavior. Accordingly, the behavior of the PAs, including the PA 714-1, may be modeled by Equation [4] above and the third order coefficient $a_3$ in Equation [4] may be a good estimate of the distortion characteristic of the PAs. In FIG. 9, the third order coefficient for the PA 714-1 is shown as $a_3(1)$. As shown, an output of the PA model circuit 730-1 is an indication of the observed third order coefficient $a_3(1)$ generated from the feedback signal $y_1$. Similarly, the target distortion characteristic received by the subtractor 732-1 may be a target third order coefficient $a_3$(target). In the example shown in FIG. 9, the bias control circuit 734-1 implements a controller given by Equation [5] below:

$$u_1 = k_i \Sigma e_3 \quad [5]$$

In Equation [5], $k_i$ is a controller gain that may be selected, for example to achieve convergence of the controller. Practically, a given value for the bias control signal $u_1(n)$ may be generated considering that the immediately prior bias control signal value $u_1(n-1)$ already includes a version of the sum of Equation [5]. Accordingly, for each sample, the bias control circuit 734-1 may find $u_1(n)$ as indicated by Equation [6] below:

$$u_1(n) = u_1(n-1) + k_i e_3 \quad [6]$$

FIG. 9 also shows a chart 752 illustrating a plot of the third order coefficient a3 versus DC bias current $I_{DC}$ provided to the PA 714-1. For example, the bias control circuit 734-1 may select the bias control signal u1 so as to drive the DC bias current for the PA 714-1 to the value $I_{DC1}$ shown in the chart 752.

Figure 10:
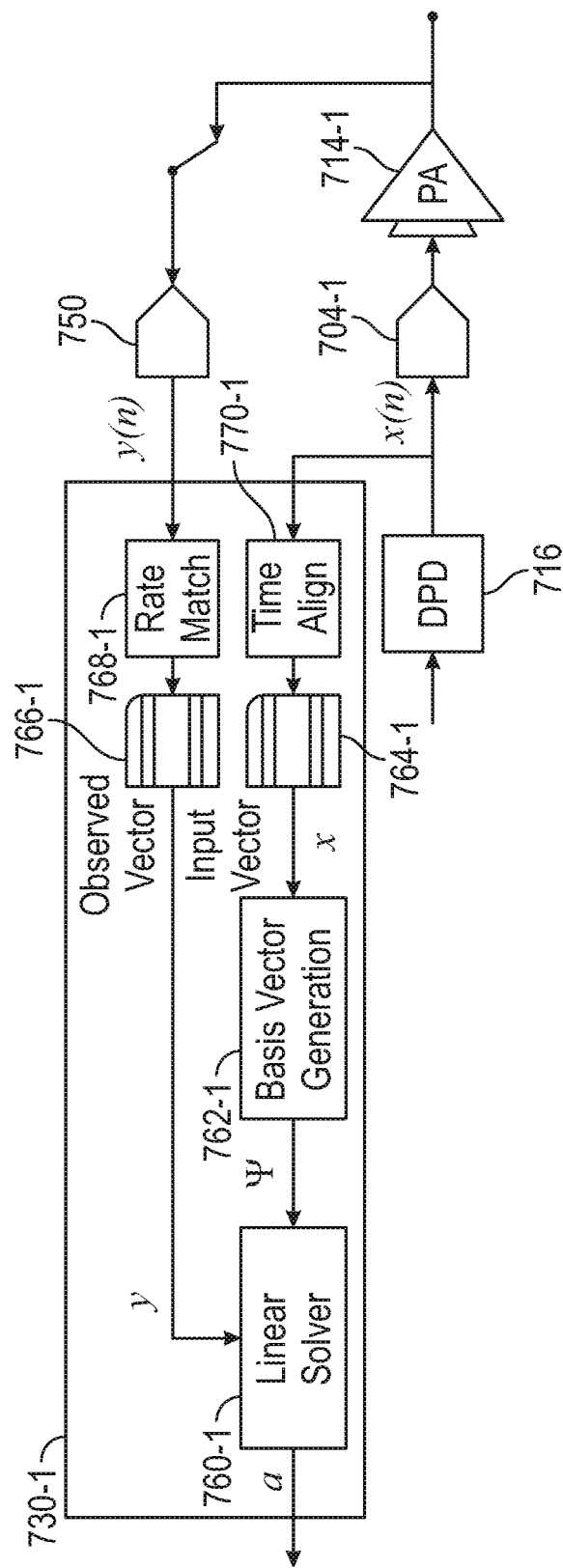
FIG. 10 is a chart showing another example of a PA model circuit shown in FIGS. 8 and 9 showing additional details and including a memory polynomial model of the PA behavior.

As described herein, in some examples, the PA model circuits 730-1, 730-1, etc. may model the distortion characteristic a of the respective PAs utilizing a model similar to that given in Equation [4] above, FIG. 10 is a chart showing another example of the PA model circuit 730-1 showing additional details and including a memory polynomial model of the PA behavior. For example, modeling the PAs with a memory polynomial may enable memory effects due to heating of the PA or other physical phenomena to be taken into account. Again, although one PA model circuit 730-1 is shown, the configuration shown in FIG. 10 may, in some examples, be reproduced across the different PAs of the circuit 700. In the example of FIG. 10, the PA model circuit 730-1 models the PA 714-1 utilizing an example memory polynomial model provided by Equation [7] below:

$$y(n) = \sum_{k=0}^{K} \sum_{m=0}^{M} a_k(m) x(n-m)^k \quad [7]$$

In Equation [7], y(n) is the feedback signal received from the PA 714-1 at a given sample n of the ADC 750. The symbol a represents the distortion characteristic of the PA 714-1, and x represents the predistorted input generated by the DPD circuit 716 (and provided to the DAC 704-1). The variable k indicates the order of considered coefficients. The variable 171 indicates the memory effects considered by the model. For example, the Equation [7] shows that the feedback signal at any given sample y(n) depends on a sum over all relevant past samples, given by in.

The feedback signal y(n) may be provided to a rate match circuit 768-1, which may match the sampling rate of the ADC 750 with the sampling rate of the predistorted input provided to the DAC 704-1. A buffer 766-1 may store values of y(n) over various values of n (e.g. various samples) to generate an observed vector y. The observed vector y may be provided to the linear solver 760-1. Samples of the predistorted input signal x(n) may be provided to a time align circuit 770-1, which may align the sample rate of the predistorted input signal x(n) with that of the feedback signal y(n). A buffer 764 may store values of x(n) over various values of n (e.g., various samples) to generate an input vector x.

In some examples, the PA model circuit 730-1 may solve the Equation [7] by formulating it as a Q×N linear system, given by Equation [8] below:

$$y = \Psi a \quad [8]$$

In Equation [8], y is the observed vector, a is the distortion characteristic of the PA 714-1, and $\Psi$ is a basis vector generated from the input vector y. For example, $\Psi$ may be a Q×N matrix of basis terms. To generate the basis vector $\Psi$, the input vectors may be provided to a basis vector generation circuit 762-1, which may generate the basis vector $\Psi$ for example, as given by Equation [9] below:

$$\Psi = [x_0, \ldots, x_M, \ldots, \ldots, x_0^K, \ldots, x_M^K] \quad [9]$$

In Equation [9], the value $x_m^k$ may be a Q×1 basis column vector given by Equation [10] below:

$$x_m^k = [x^k(n-m), \ldots, x^k(n-m-Q)]^H \quad [10]$$

Referring back to Equation [8], the distortion characteristic a may be an N×1 vector of unknowns given by Equation [11] below:

$$a = [a_1(0), \ldots, a_1(M), \ldots, a_K(0), \ldots, a_K(M)]^H \quad [11]$$

The observed vector y and the basis vector $\Psi$ may be provided to a linear solver 760-1, which may generate the distortion characteristic a, for example, utilizing a least squares technique illustrated by Equation [12] below:

$$a = (\Psi^H \Psi)^{-1} \Psi^H y \quad [12]$$

The result may be provided to the bias control circuit 734-1 to generate the bias control signal $u_1$, for example, as described herein. The various E&C circuits 718-1, 718-2, 718-P, described herein by examples in FIGS. 7-10, may be implemented in any combination of hardware and software. In some examples, E&C circuits 718-1, 718-2, 718-P may be implemented in software executed at a digital signal processor (DSP) or other suitable hardware processor unit.

Figure 11:
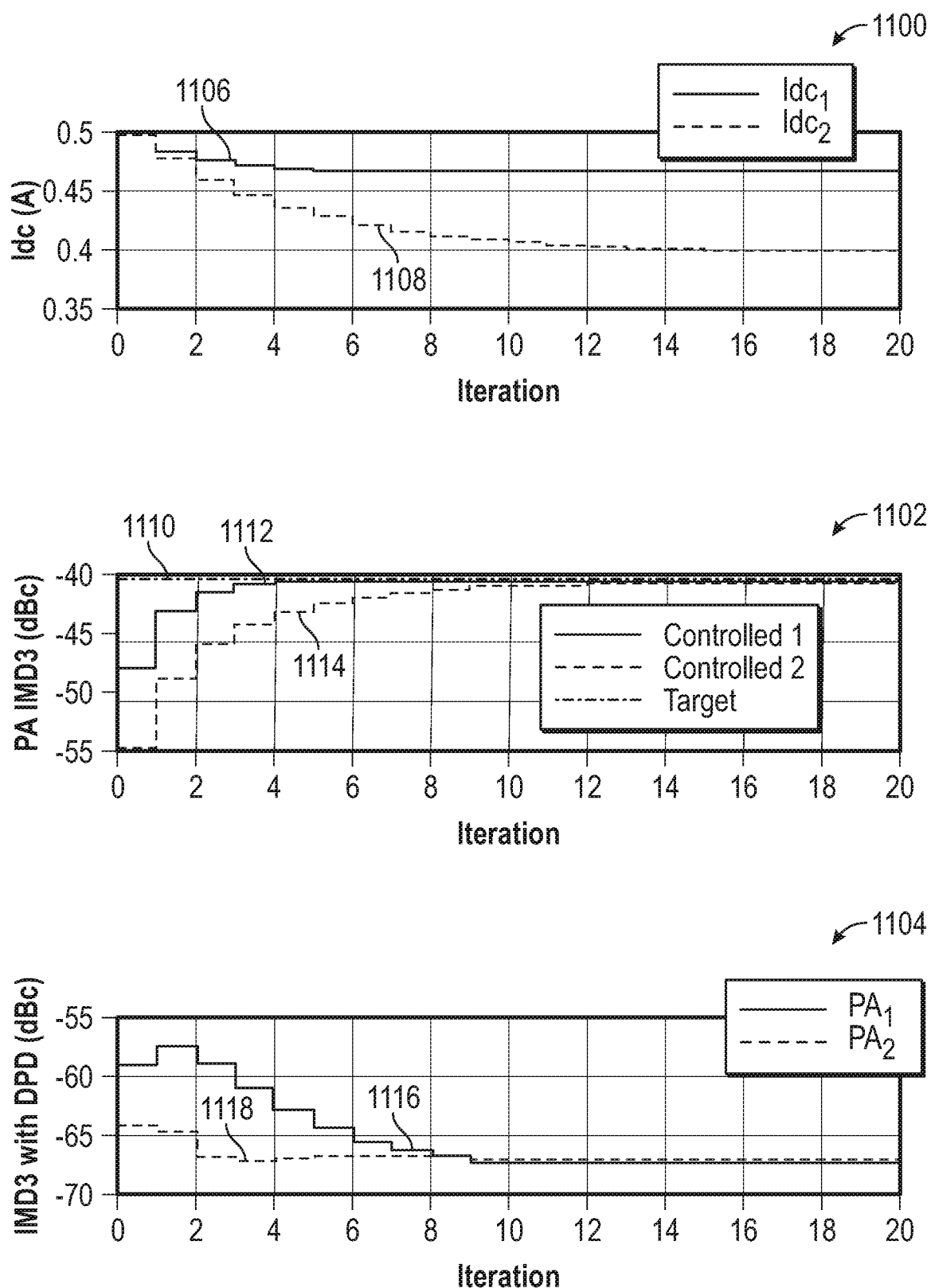
FIG. 11 is a chart showing results of a simulation of an example circuit including a single DPD circuit and two PAs.

FIG. 11 is a chart showing results of a simulation of an example circuit including a single DPD circuit and two PAs. In the example of FIG. 11, the two PAs are memoryless and dominated by third order distortion. For example, the PA model circuits may generate the observed distortion characteristics an by solving Equation [4] above for the third order coefficient $a_3$. The third order error may be linearly related to bias current, for example, similar to the relationship shown in the chart 752 of FIG. 9.

FIG. 11 includes three plots 1100, 1102, 1104 showing characteristics of the two PAs over various iterations. Iterations are illustrated on the horizontal or x-axes of the plots 1100, 1102, 1104. An iteration, for example, may correspond to one sample n of the predistorted input signal and the relevant feedback signals. The plot 1100 shows the bias currents provided to the first PA (current 1106) and the bias current provided to the second PA (current 1108). As shown, the bias currents 1106, 1108 begin at the same initial value of about 0.5 A, but diverge in later iterations to about 0.47 A (current 1106) and about 0.4 A (current 1108).

Plot 1102 shows corresponding changes to the distortion characteristic of the amplifiers. Plot 1102 shows a target distortion characteristic ($a_{target}$) of −40 dBc, or an $a_3$ of about 0.005 V. In the example of FIG. 11, the distortion characteristic of the PAs is indicated by the third order coefficient $a_3$. Initially, the distortion characteristic for the first PA 1112 is at about −48 dBc and the distortion characteristic for the second PA 1114 is at about −55 dBc. As illustrated, both distortion characteristics 1112, 1114 converge towards the target as additional iterations are performed. This is borne out in the plot 1104, which shows the distortion characteristics of the first PA (1116) and the second PA (1118) with digital predistortion provided by a single DPD circuit. As shown, the distortion characteristics 1116, 1118 of the PAs converge at less than −65 dBc, indicating that the single DPD circuit may correct for both PAs to an acceptable distortion level.

Figure 12:
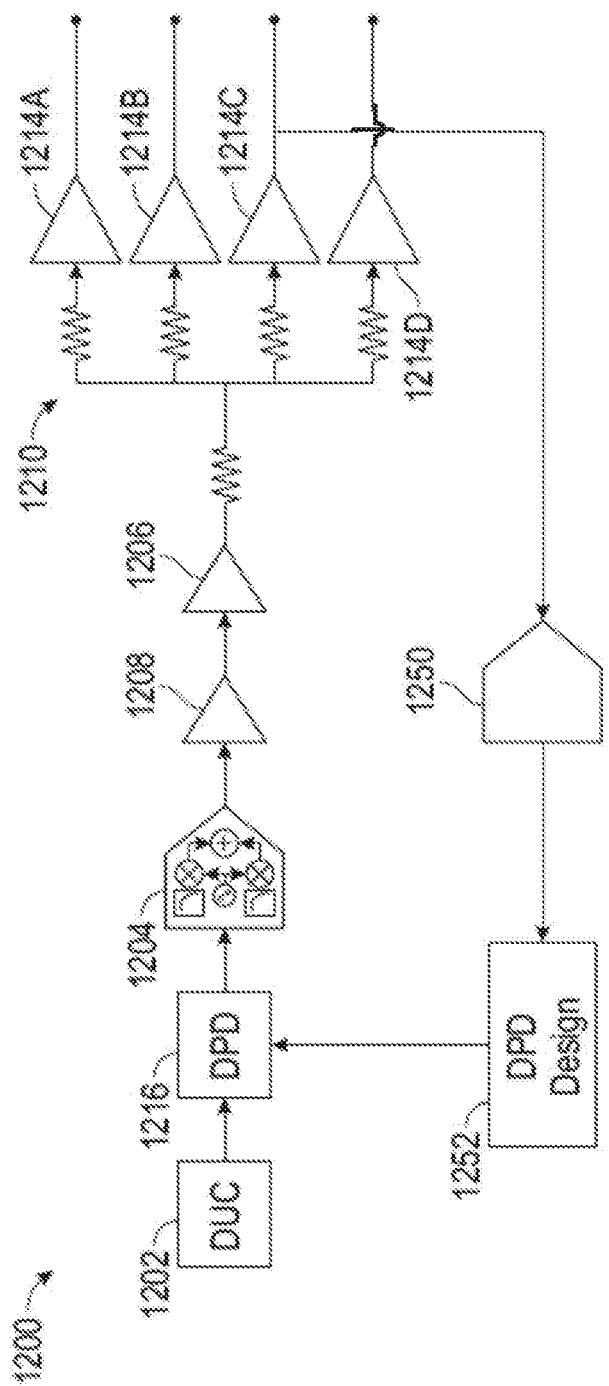
FIG. 12 is a diagram showing one example of a circuit including multiple PAs and a single DPD circuit trained by the output of one of the PAs.

When utilizing a single DPD circuit for multiple PAs, the single DPD circuit may be trained based on any suitable combination of outputs from the PAs. For example, FIG. 12 is a diagram showing one example of a circuit 1200 including multiple PAs 1214-D and a single DPD circuit 1216 trained by the output of one of the PAs 1214C. For example, a DUC 1202 may generate an input signal, provided to the DPD circuit 1216. The DPD circuit 1216 may generate a predistorted input signal that may be converted to analog at DAC 1204, pre-amplified at pre-amplifiers 1208, 1206, split at power splitter 1210 and provided to the respective PAs 1214A, 1214B, 1214C, 1214D.

Figure 13:
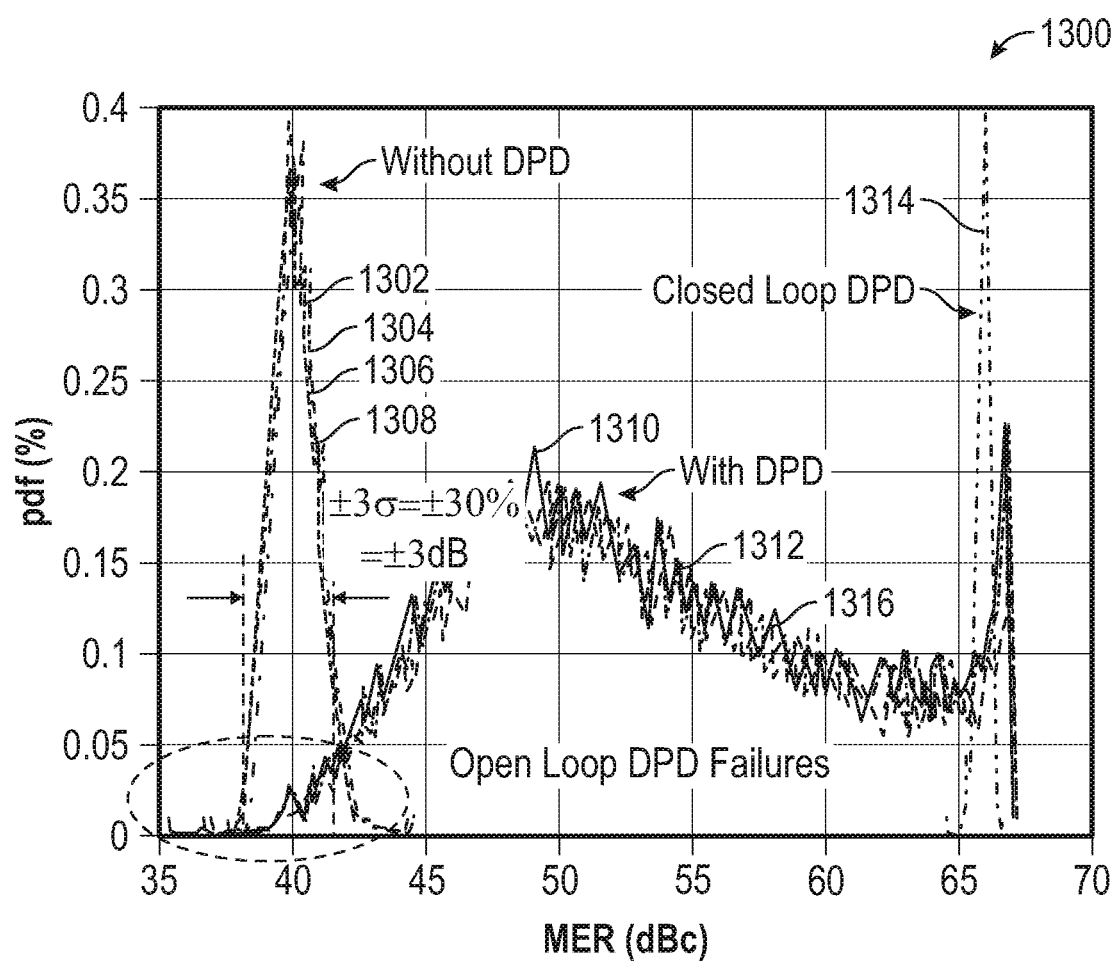
FIG. 13 is a chart illustrating a simulation of the circuit of FIG. 12.

In the example of FIG. 12, the output of the PA 1214C is digitized at ADC 1250 and provided to a DPD design or adaptation circuit 1252. The DPD design circuit 1252 may train the DPD 1216 based on the output of the PA 1214C utilizing any suitable method. FIG. 13 is a chart 1300 illustrating a simulation of the circuit 1200. On a horizontal or x-axis, the chart 1300 shows MER, measured in dBc. On a vertical or y-axis, the chart 1300 shows a probability distribution function (pdf) illustrating the percentage of simulated trials in which the MER for the respective PAs fell at the indicated positions on the x-axis.

The chart 1300 shows a series of simulations run without the DPD circuit 1216. These are illustrated by plot 1302 corresponding to PA 1214A; plot 1304 corresponding to PA 1214B; plot 1306 corresponding to PA 1214C, and plot 1308 corresponding to PA 1214D. As illustrated, these plots are clustered at about 40 dBc on the x-axis, with a plus or minus three standard deviations being about 3 dBc. The chart 1300 also shows a series of simulations run with the DPD circuit 1216 active and trained based on a feedback signal from the PA 1214C only, as shown in FIG. 12. These are illustrated by a plot 1310 corresponding to PA 1214A; a plot 1312 corresponding to the PA 1214B, a plot 1314 corresponding to PA 1214C and a plot 1316 corresponding to PA 1214D. As shown, the performance of all PAs improves, with the performance of the PA 1214C providing the feedback signal improving the most.

Figure 14:
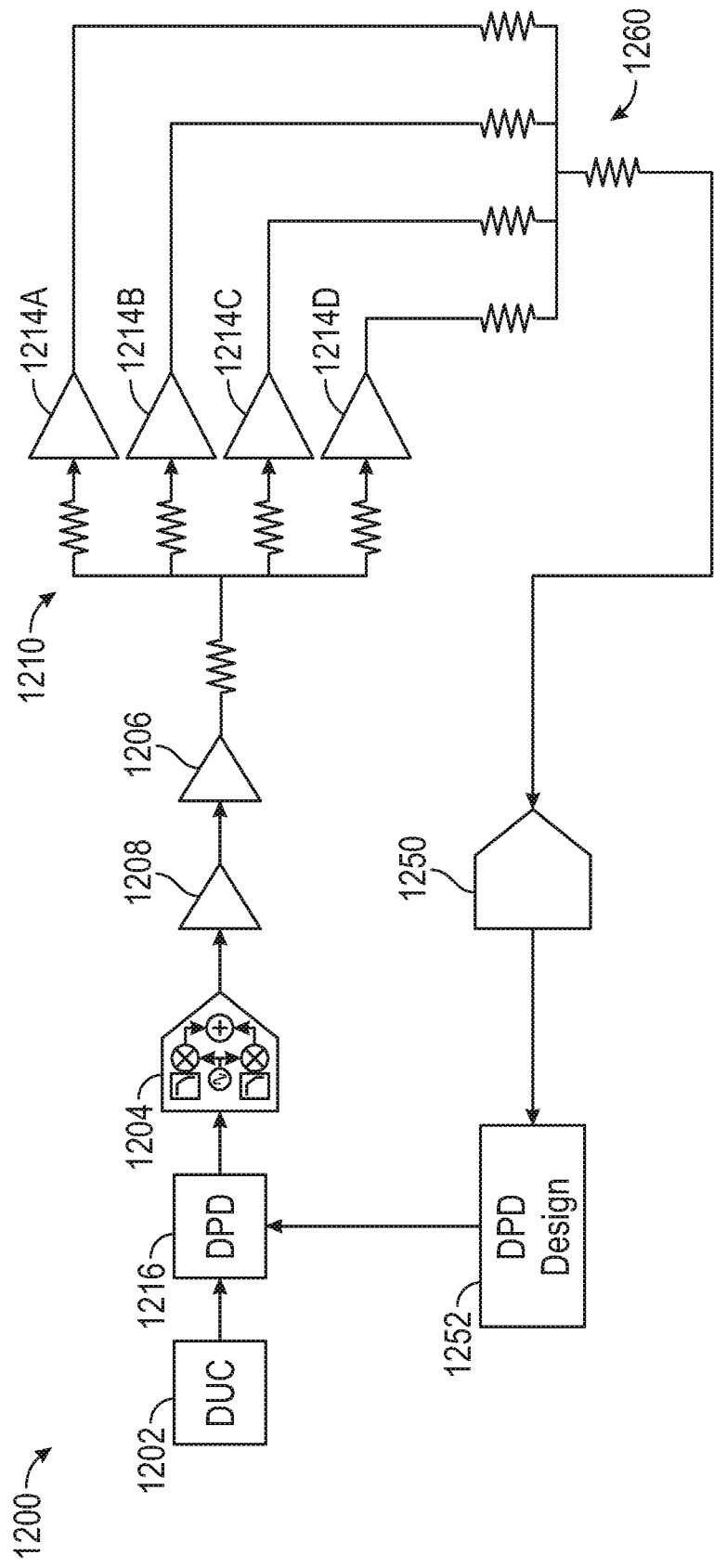
FIG. 14 is a diagram showing another example of the circuit with the DPD design circuit receiving a feedback signal that is combined from all of the PAs.
Figure 15:
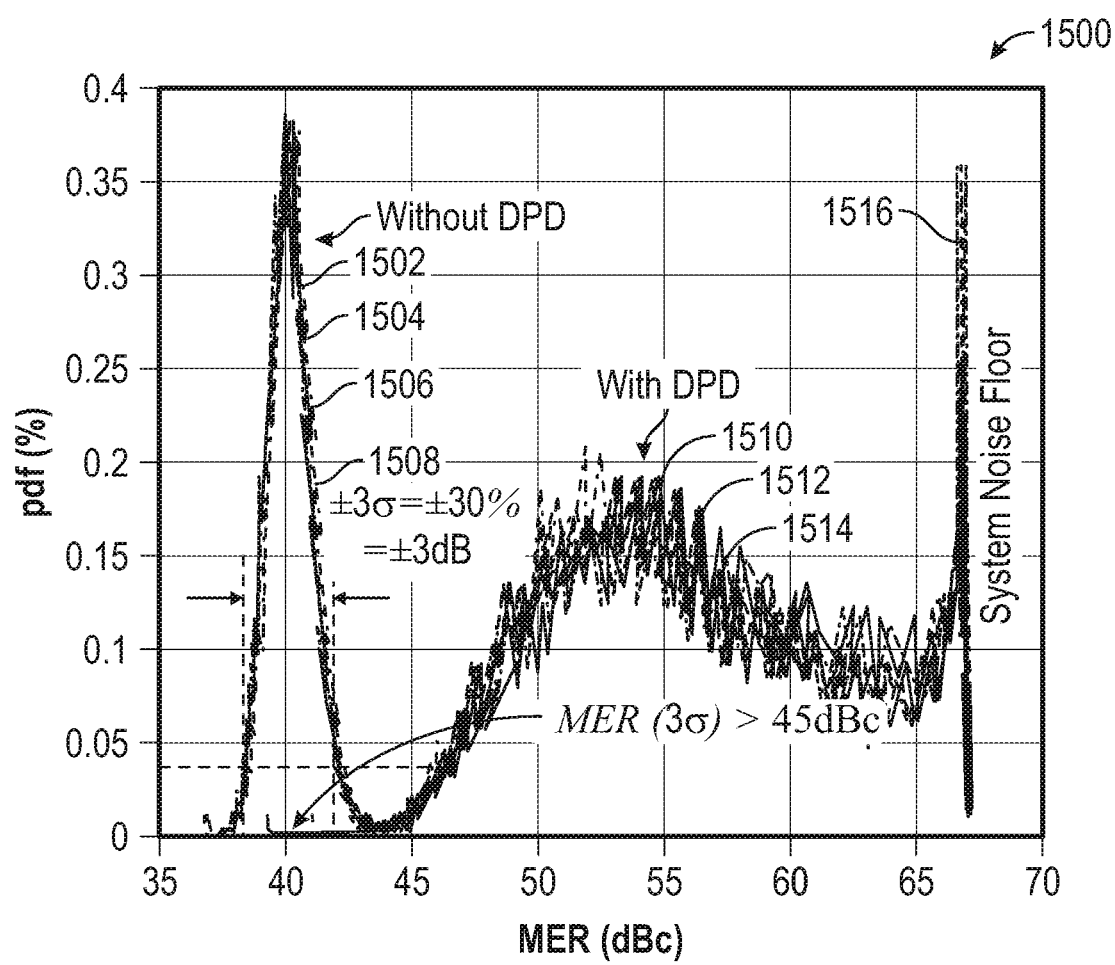
FIG. 15 is a chart illustrating a simulation of a circuit in the example configuration shown in FIG. 14.

FIG. 14 is a diagram showing another example of the circuit 1200 with the DPD design circuit 1252 receiving a feedback signal that is combined from all of the PAs 1214A-D. For example, FIG. 14 shows a power combiner 1260 that receives the outputs of the various PAs 1214A-D and generates a combined feedback signal that is provided to the ADC 1250 and ultimately to the DPD design circuit 1252. FIG. 15 is a chart 1500 illustrating a simulation of the circuit 1200 in the example configuration shown in FIG. 14. The chart 1500 shows a series of simulations run without the DPD circuit 1216. These are illustrated by plot 1502 corresponding to PA 1214A; plot 1504 corresponding to PA 1214B; plot 1506 corresponding to PA 1214C, and plot 1508 corresponding to PA 1214D. The chart 1500 also shows a series of simulations run with the DPD circuit 1216 active and trained based on a feedback signal from all of the PAs 1214A-1214C, as shown in FIG. 142. These are illustrated by a plot 1510 corresponding to PA 1214A; a plot 1512 corresponding to the PA 1214B, a plot 1514 corresponding to PA 1214C and a plot 1516 corresponding to PA 1214D. As shown, the performance of all PAs improves, with the performance of the PA 1214C, with the performance often approaching the system noise floor.

Figure 16:
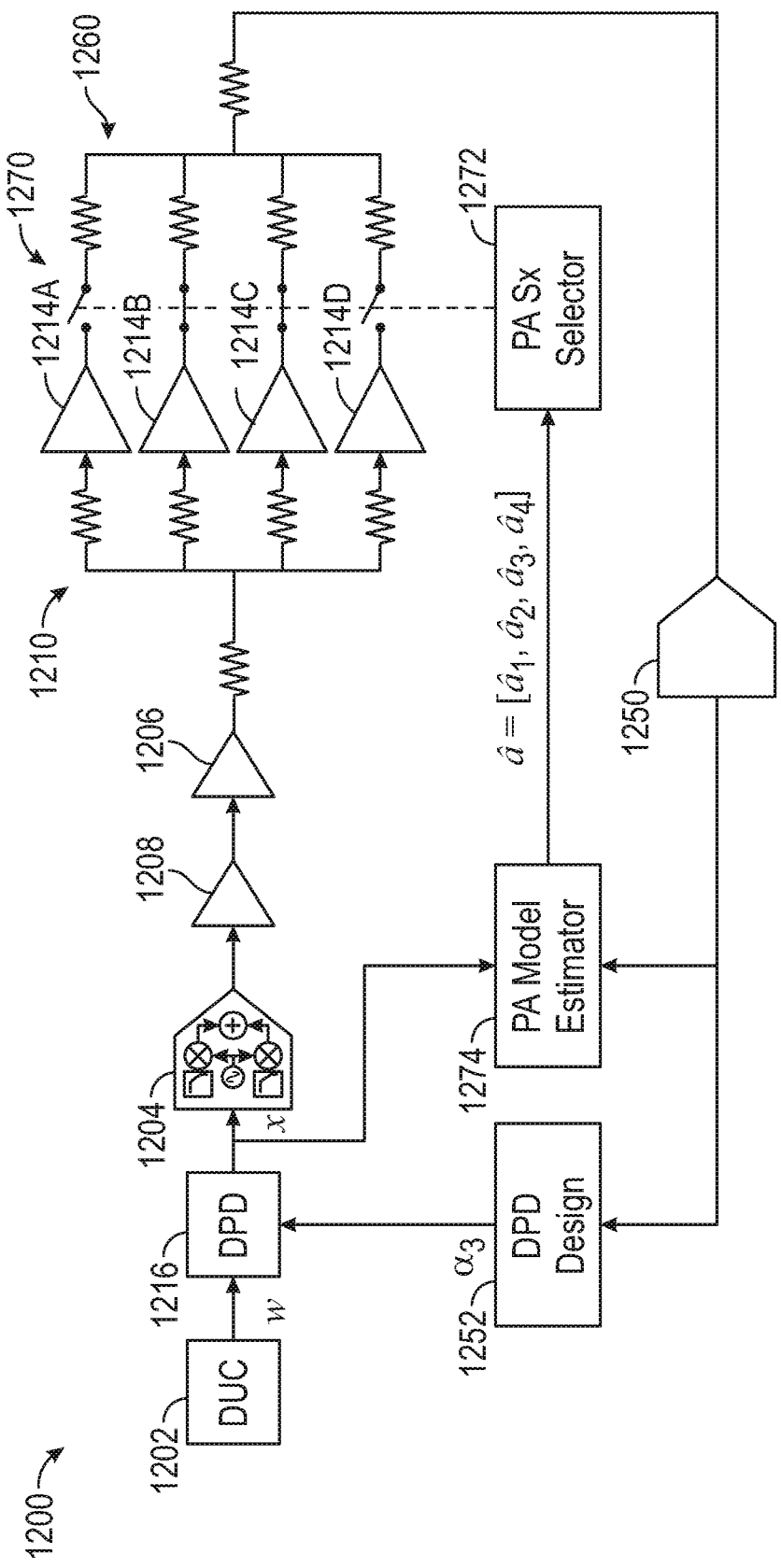
FIG. 16 is a diagram showing one example of the circuit including multiple PAs and a DPD circuit where the DPD circuit is trained on a feedback signal that is a combination of the outputs of the most and least linear PAs.

Another approach to training a DPD circuit for multiple PAs may include taking a feedback that is a combination of the most linear PA (e.g., the PA with the least distortion) and the least linear PA (e.g., the PA with the most distortion). FIG. 16 is a diagram showing one example of the circuit 1200 including multiple PAs 1214A-D and a DPD circuit 1216 where the DPD circuit 1216 is trained on a feedback signal that is a combination of the outputs of the most and least linear PAs. In the example configuration shown in FIG. 16, the circuit 1200 includes the power combiner 1260 with a switch network 1270 positioned between the outputs of the power combiner 1260 and the ADC 1250. The switch network 1270 may be selectable to connect an output or outputs of one or more of the PAs to the power combiner 1260. The switch network may be controlled by a PA selector 1272. Also, in the example configuration showing in FIG. 16, the circuit 1200 includes a PA model estimator 1274 that receives the predistorted input signal x as shown.

The PA model estimator 1274 may receive the feedback signal from the ADC 1250 and the predistorted input x from the DPD circuit 1216 and may generate a distortion vector â including values for distortion characteristics of the PAs 1214A-D. The distortion vector â may be determined in any suitable manner and provided to the PA selector circuit 1272. The PA selector circuit 1272 may select the minimum and maximum distortion values form the distortion vector â and configure the switch network 1270 to provide the outputs of the PAs corresponding to the minimum and maximum distortion values to the power combiner 1260.

Figure 17:
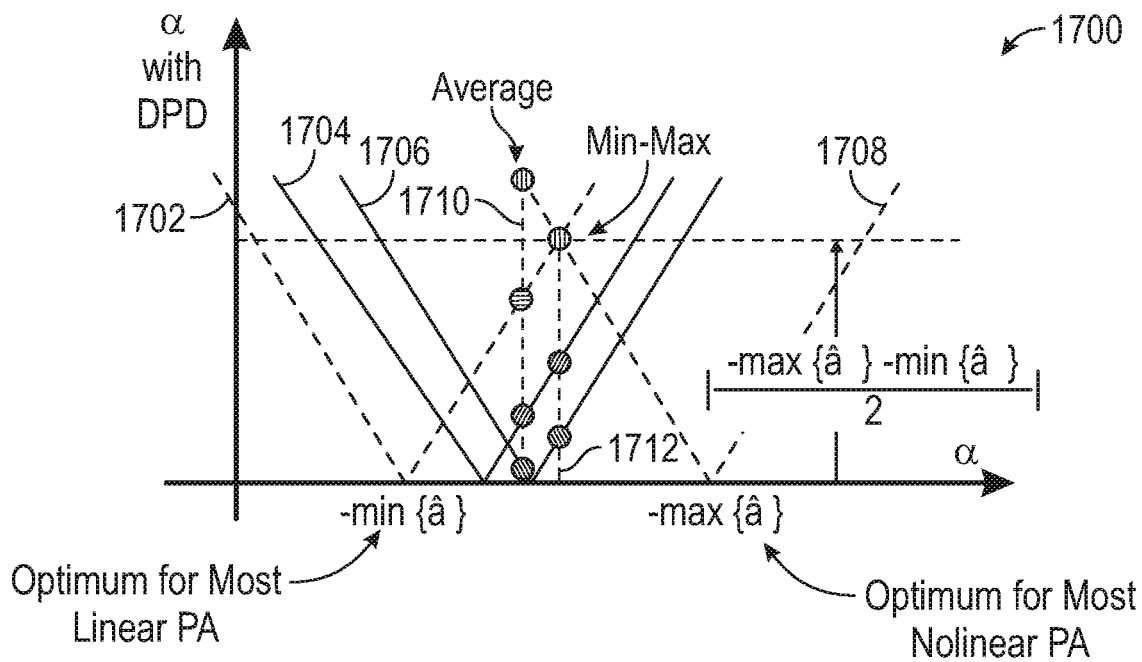
FIG. 17 is a chart showing characteristics of a circuit in the example configuration shown in FIG. 16.

FIG. 17 is a chart 1700 showing characteristics of the circuit 1200 in the configuration shown in FIG. 16. The chart 1700 includes a horizontal or x-axis showing a target the distortion characteristic a of the PAs and a vertical or y-axis showing an actual distortion characteristic for the PAs with the DPD circuit operating. Curve 1702 corresponds to the PA 1214B. Curve 1704 corresponds to the PA 1214A. Curve 1706 corresponds to the PA 1214D. Curve 1708 corresponds to the PA 1214C. As illustrated, the PA 1214B, indicated by the curve 1702, has the most linear distortion characteristic while the PA 1214C (curve 1708) has the least linear characteristic. Selecting a feedback signal that is a combination or average of all of the outputs of the PAs 1214A-D would lead to a target distortion characteristic a at the value indicated by the line 1710. As shown, although the observed distortion characteristic for the PA 1214C are higher than for the other PAs. If the feedback signal is a combination or average of only the most and least linear PAs 1214B and 1214C, the target distortion characteristic is at the value indicated by the line 1712. As shown, this configuration yields a lower overall distortion than the example where the target distortion characteristic is determined from the outputs of all PAs 1214A-D.

In general, combining the outputs of the PAs with the most and least linear outputs may yield lower distortion overall. In some cases, however, the average or combined outputs of all PAs can lead to better results (for example, in the configuration shown in FIG. 14). For example, the PA characteristics shown in FIG. 17 include three PA characteristics clustered around the most linear PA characteristic. Here the average driven DPD would yield better performance of these PAs but inferior performance for the less linear PA, at least relative to the configuration shown in FIGS. 16-17.

Figure 18:
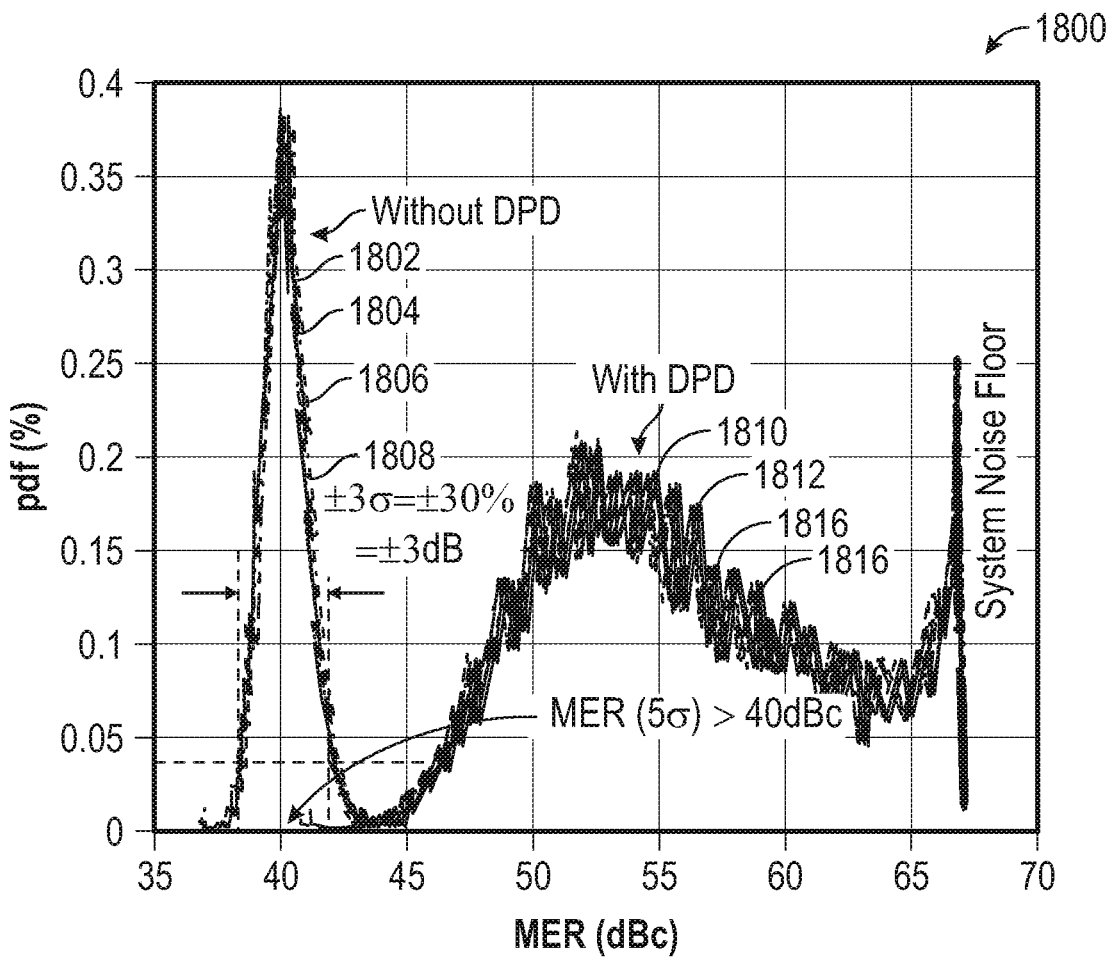
FIG. 18 is a chart 1800 illustrating a simulation of the circuit in the example configuration shown in FIG. 14.

FIG. 18 is a chart 1800 illustrating a simulation of the circuit 1200 in the example configuration shown in FIG. 14. The chart 1800 shows a series of simulations run without the DPD circuit 1216. These are illustrated by plot 1802 corresponding to PA 1214A, plot 1804 corresponding to PA 1214B; plot 1806 corresponding to PA 1214C, and plot 1808 corresponding to PA 1214D. The chart 1800 also shows a series of simulations run with the DPD circuit 1216 active and trained based on a feedback signal from the average of the PAs 1214A-D, as shown in FIG. 14. These are illustrated by a plot 1810 corresponding to PA 1214A; a plot 1812 corresponding to the PA 1214B, a plot 1814 corresponding to PA 1214C and a plot 1816 corresponding to PA 1214D, As shown, the five sigma MER for the PAs 1214A-D is greater than 40 dBc.

Figure 19:
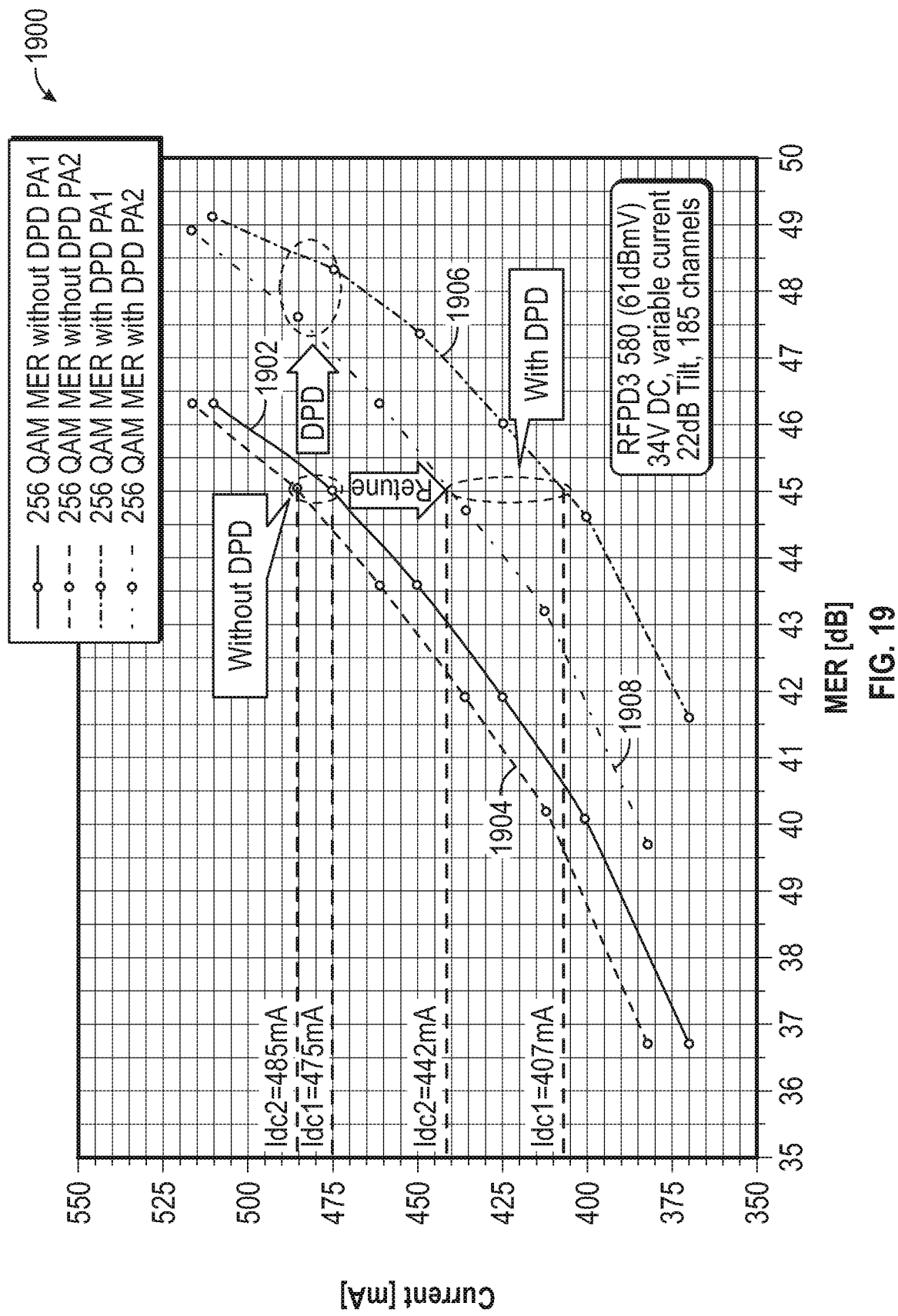
FIG. 19 is a chart showing example test results for a circuit including two PAs and one DPD circuit that can provide a predistorted input signal to both PAs.

FIG. 19 is a chart 1900 showing example test results for a circuit including two PAs and one DPD circuit that can provide a predistorted input signal to both PAs. In the chart 1900, the horizontal or x-axis shows MER and the vertical or y-axis indicates bias current in mA. Curve 1902 describes the first PA with the DPD circuit disabled. Curve 1902 describes the second PA with the DPD circuit disabled. Curve 1906 describes the first PA with the DPD circuit enabled. Curve 1908 describes the second PA with the DPD circuit disabled.

As illustrated, without DPD, to achieve a MER of less than −45 dB, the first PA is provided with a DC bias current (Idc1) of 475 mA and the second PA is provided with a DC bias current (Idc2) of 485 mA. If the DPD circuit is enabled with those bias currents, the MER drops to −47.5 dB for the first PA and −46.5 for the second PA. The chart 1900 also demonstrates that with the DPD circuit trained as described here, −45 dB MER may be achieved with lower DC bias currents (e.g., 407 mA for the first PA and 442 mA for the second PA).

In one example approach, a power amplifier system may include a digital predistortion circuit configured to receive an input signal and generate a predistorted input signal; a first power amplifier coupled to receive the predistorted input signal; a second power amplifier coupled to receive the predistorted input signal; and a bias feedback circuit configured to adjust at least one of a bias of the first power amplifier or a bias of the second power amplifier to align a first nonlinear behavior of the first power amplifier with a second nonlinear behavior of the second power amplifier.

In some examples, the power amplifier system also includes a power combiner and a digital predistortion design circuit. The power combiner may be electrically coupled to receive a first output of the first power amplifier and a second output of the second power amplifier and generate a combined output. The digital predistortion design circuit may be configured to receive the combined output and adjust the digital predistortion circuit based at least in part on the combined output.

In some examples, the power amplifier system also includes a plurality of power amplifiers, including the first and second power amplifier, which are coupled to receive the predistorted input signal. The power amplifier system may also include a digital predistortion design circuit configured to: select a most linear power amplifier from the plurality of power amplifiers; select a least linear power amplifier from the plurality of power amplifiers; and adjust the digital predistortion circuit based at least in part on a combination of an output of the most linear power amplifier and an output of the least linear power amplifier.

In another example approach, a power amplifier system comprises a digital predistortion circuit, a first power amplifier, and a second power amplifier. The digital predistortion circuit may be configured to receive an input signal and generate a predistorted input signal. The first power amplifier be coupled to receive the predistorted input signal as the first signal input. The second power amplifier may be coupled to receive the predistorted input signal at the second signal input. The power amplifier circuit may also comprise a first power amplifier bias control circuit configured to: receive the predistorted input signal; receive a first feedback signal indicative of the first signal output of the first power amplifier; generate a bias error signal based at least in part on the predistorted input signal and the first feedback signal; and provide a first power amplifier bias signal to the first power amplifier based at least in part on the bias error signal.

In some examples, the power amplifier system also includes a power combiner and a digital predistortion design circuit. The power combiner may be electrically coupled to receive a first output of the first power amplifier and a second output of the second power amplifier and generate a combined output. The digital predistortion design circuit may be configured to receive the combined output and adjust the digital predistortion circuit based at least in part on the combined output.

In some examples, the power amplifier system also includes a plurality of power amplifiers, including the first and second power amplifier, which are coupled to receive the predistorted input signal. The power amplifier system may also include a digital predistortion design circuit configured to: select a most linear power amplifier from the plurality of power amplifiers; select a least linear power amplifier from the plurality of power amplifiers; and adjust the digital predistortion circuit based at least in part on a combination of an output of the most linear power amplifier and an output of the least linear power amplifier.

In another approach, a power amplifier system comprises a digital predistortion circuit, a first power amplifier, and a second power amplifier. The digital predistortion circuit may be configured to receive an input signal and generate a predistorted input signal. The first power amplifier and the second power amplifier may be coupled to receive the predistorted input signal. The power amplifier system may also comprise a power combiner and a digital predistortion design circuit. The power combiner may be electrically coupled to receive a first output of the first power amplifier and a second output of the second power amplifier to generate a combined output. The digital predistortion design circuit may be configured to receive the combined output and adjust the digital predistortion circuit based at least in part on the combined output.

In another approach, a power amplifier system comprises a digital predistortion circuit, a plurality of power amplifiers, and a digital predistortion design circuit. The digital predistortion circuit may be configured to receive an input signal and generate a predistorted input signal. Each of the plurality of power amplifiers may be coupled to receive the predistorted input signal. The digital predistortion design circuit may be configured to: select a most linear power amplifier from the plurality of power amplifiers; select a least linear power amplifier from the plurality of power amplifiers; and adjust the digital predistortion circuit based at least in part on a combination of an output of the most linear power amplifier and an output of the least linear power amplifier.

In another approach, a power amplifier system comprises a digital predistortion circuit, a plurality of power amplifiers, a bias feedback circuit, and a digital predistortion design circuit. The digital predistortion circuit may be configured to receive an input signal and generate a predistorted input signal. The plurality of power amplifiers may be coupled to receive the predistorted input signal. The plurality of power amplifiers may also comprise a first power amplifier and a second power amplifier. The bias feedback circuit may be configured to adjust at least one of a bias of the first power amplifier or a bias of the second power amplifier to align a first nonlinear behavior of the first power amplifier with a second nonlinear behavior of the second power amplifier. The digital predistortion design circuit may be configured to select a most linear power amplifier from the plurality of power amplifiers and a least linear power amplifier from the plurality of power amplifiers. The digital predistortion design circuit may also be configured to adjust the digital predistortion circuit based at least in part on a combination of an output of the most linear power amplifier and an output of the least linear power amplifier.

In another approach, a power amplifier system comprises a digital predistortion circuit, a plurality of power amplifiers comprising a first power amplifier and a second power amplifier, a first power amplifier bias control circuit, and a digital predistortion design circuit. The digital predistortion circuit may be configured to receive an input signal and generate a predistorted input signal. The first power amplifier bias control circuit may be configured to receive the predistorted input signal and a first feedback signal indicative of a first signal output of the first power amplifier. The first power amplifier bias control circuit may also be configured to generate a bias error signal based at least in part on the predistorted input signal and the first feedback signal and provide a first power amplifier bias signal to the first power amplifier based at least in part on the bias error signal. The digital predistortion design circuit may be configured to select a most linear power amplifier from the plurality of power amplifiers and a least linear power amplifier from the plurality of power amplifiers. The digital predistortion design circuit may also be configured to adjust the digital predistortion circuit based at least in part on a combination of an output of the most linear power amplifier and an output of the least linear power amplifier.

In another approach, a power amplifier system comprises a digital predistortion circuit, a plurality of power amplifiers, and a digital predistortion design circuit. The digital predistortion circuit may be configured to receive an input signal and generate a predistorted input signal. Each of the plurality of power amplifiers may be coupled to receive the predistorted input signal. The digital predistortion design circuit may be configured to select a most linear power amplifier from the plurality of power amplifiers and a least linear power amplifier from the plurality of power amplifiers. The digital predistortion design circuit may also be configured to adjust the digital predistortion circuit based at least in part on a combination of an output of the most linear power amplifier and an output of the least linear power amplifier.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, interact protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

We claim:

1. A power amplifier circuit, comprising:
   a digital predistortion circuit configured to generate a predistorted input signal based at least in part on an input signal;
   a first power amplifier configured to receive a power amplifier input signal and generate a first amplified signal, wherein the power amplifier input signal is based at least in part on the predistorted input signal;
   a second power amplifier configured to receive the power amplifier input signal and generate a second amplified signal; and
   a bias feedback circuit configured to adjust a bias of the first power amplifier to align a first nonlinear behavior of the first power amplifier with a second nonlinear behavior of the second power amplifier.

2. The power amplifier circuit of claim 1, further comprising:
   a power combiner to generate a combined output signal based at least in part on the first amplified signal and the second amplified signal; and
   a digital predistortion design circuit configured to adjust the digital predistortion circuit based at least in part on the combined output signal.

3. The power amplifier circuit of claim 1, further comprising:

a plurality of power amplifiers, wherein the plurality of power amplifiers comprises the first power amplifier and the second power amplifier; and a digital predistortion design circuit configured to perform operations comprising:

selecting a most linear power amplifier from the plurality of power amplifiers;

selecting a least linear power amplifier from the plurality of power amplifiers; and adjusting the digital predistortion circuit based at least in part on a combination of an output of the most linear power amplifier and an output of the least linear power amplifier.

4. The power amplifier circuit of claim 1, wherein the bias feedback circuit is further configured to perform operations comprising:

receiving the predistorted input signal;

receiving a first feedback signal indicative of the first amplified signal;

generating a bias error signal based at least in part on the predistorted input signal and the first feedback signal; and providing a first power amplifier bias signal to the first power amplifier based at least in part on the bias error signal.

5. The power amplifier circuit of claim 1, further comprising:

a first mixer to generate a first mixer output signal based at least in part on a first mixing signal and the predistorted input signal, wherein the first amplified signal is also based at least in part on the first mixer output signal; and a second mixer to generate a second mixer output signal based at least in part on a second mixing signal and the predistorted input signal, wherein the second amplified signal is also based at least in part on the second mixer output signal.

6. The power amplifier circuit of claim 1, wherein the bias feedback circuit further comprises:

a first estimate and control circuit configured to generate a first bias control signal;

a first power supply unit configured to generate a first bias current for the first power amplifier based at least in part on the first bias control signal;

a second estimate and control circuit configured to generate a second bias control signal; and a second power supply unit configured to generate a second bias current for the second power amplifier based at least in part on the second bias control signal.

7. The power amplifier circuit of claim 1, wherein the bias feedback circuit further comprises:

a first nonlinear model circuit configured to generate a first distortion characteristic describing the first power amplifier based at least in part on the first amplified signal; and a bias control circuit configured to generate a first bias control signal based at least in part on a first distortion error signal indicating a difference between the first distortion characteristic and a target distortion characteristic.

8. The power amplifier circuit of claim 1, wherein the bias feedback circuit is configured to adjust at least one of the bias of the first power amplifier or the bias of the second power amplifier based at least in part on the first amplified signal.

9. A method for driving a first power amplifier and a second power amplifier with a digital predistortion circuit, the method comprising:

generating, with the digital predistortion circuit, a predistorted input signal based at least in part on an input signal;

receiving, by the first power amplifier, a power amplifier input signal, the power amplifier input signal based at least in part on the predistorted input signal;

generating, with the first power amplifier, a first amplified signal based at least in part on the power amplifier input signal;

receiving, by the second power amplifier, the power amplifier input signal;

generating, with the second power amplifier, a second amplified signal based at least in part on the power amplifier input signal; and adjusting at least one of a bias of the first power amplifier or a bias of the second power amplifier to align a first nonlinear behavior of the first power amplifier with a second nonlinear behavior of the second power amplifier.

10. The method of claim 9, further comprising:

generating a combined output signal based at least in part on the first amplified signal and the second amplified signal; and adjusting the digital predistortion circuit based at least in part on the combined output signal.

11. The method of claim 9, further comprising:

selecting from a plurality of power amplifiers configured to receive the power amplifier input signal, a most linear power amplifier from the plurality of power amplifiers, wherein the plurality of power amplifiers comprises the first power amplifier and the second power amplifier;

selecting from the plurality of power amplifiers a least linear power amplifier; and adjusting the digital predistortion circuit based at least in part on a combination of an output of the most linear power amplifier and an output of the least linear power amplifier.

12. The method of claim 9, further comprising:

receiving the predistorted input signal;

receiving a first feedback signal indicative of the first amplified signal, generating a bias error signal based at least in part on the predistorted input signal and the first feedback signal; and providing a first power amplifier bias signal to the first power amplifier based at least in part on the bias error signal.

13. The method of claim 9, further comprising:

generating a first mixer output signal based at least in part on a first mixing signal and the predistorted input signal, wherein the first amplified signal is also based at least in part on the first mixer output signal; and generating a second mixer output signal based at least in part on a second mixing signal and the predistorted input signal, wherein the second amplified signal is also based at least in part on the second mixer output signal.

14. The method of claim 9, further comprising:

generating a first bias control signal;

generating a first bias current for the first power amplifier based at least in part on the first bias control signal;

generating a second bias control signal; and generating a second bias current for the second power amplifier based at least in part on the second bias control signal.

15. The method of claim 9, further comprising:

generating a first distortion characteristic describing the first power amplifier based at least in part on the first amplified signal; and generating a first bias control signal based at least in part on a first distortion error signal indicating a difference between the first distortion characteristic and a target distortion characteristic.

16. The method of claim 9, further comprising adjusting at least one of the bias of the first power amplifier or the bias of the second power amplifier based at least in part on the first amplified signal.

17. A power amplifier circuit, comprising:

a digital predistortion circuit configured to generate a predistorted input signal based at least in part on an input signal;

a plurality of power amplifiers, wherein each of the plurality of power amplifiers is electrically coupled to receive the predistorted input signal; and a digital predistortion design circuit configured to perform operations comprising:

selecting a most linear power amplifier from the plurality of power amplifiers;

selecting a least linear power amplifier from the plurality of power amplifiers; and adjusting the digital predistortion circuit based at least in part on a combination of an output of the most linear power amplifier and an output of the least linear power amplifier.

18. The power amplifier circuit of claim 17, wherein the plurality of power amplifiers comprises a first power amplifier and a second power amplifier, further comprising:

a bias feedback circuit configured to perform operations comprising adjusting at least one of a bias of the first power amplifier or a bias of the second power amplifier to align a first nonlinear behavior of the first power amplifier with a second nonlinear behavior of the second power amplifier.

19. The power amplifier circuit of claim 17, further comprising a power amplifier bias control circuit configured to perform operations comprising:

receiving the predistorted input signal;

receiving a first feedback signal indicative of a first signal output of a first power amplifier of the plurality of power amplifiers;

generating a bias error signal based at least in part on the predistorted input signal and the first feedback signal; and providing a first power amplifier bias signal to the first power amplifier, wherein the first power amplifier bias signal is based at least in part on the bias error signal.

20. The power amplifier circuit of claim 17, further comprising:

a first mixer to generate a first mixer output signal based at least in part on a first mixing signal and the predistorted input signal, wherein a first amplified signal generated by a first power amplifier of the plurality of power amplifiers is based at least in part on the first mixer output signal; and a second mixer to generate a second mixer output signal based at least in part on a second mixing signal and the predistorted input signal, wherein a second amplified signal generated by a second power amplifier of the plurality of power amplifiers is based at least in part on the second mixer output signal.

* * * * *